United States Patent [19]
Kang et al.

[11] Patent Number: 5,610,542
[45] Date of Patent: Mar. 11, 1997

[54] POWER-UP DETECTION CIRCUIT

[75] Inventors: Hee-bok Kang, Daejon; Hyun J. Kim, Kwangju, both of Rep. of Korea

[73] Assignee: LG Semicon Co., Ltd., Cheongju, Rep. of Korea

[21] Appl. No.: 574,005

[22] Filed: Dec. 18, 1995

[30] Foreign Application Priority Data

Jul. 8, 1995 [KR] Rep. of Korea .................. 20088/1995

[51] Int. Cl.$^6$ ........................................ H03L 7/00
[52] U.S. Cl. ................................... 327/143; 327/142
[58] Field of Search ................................ 327/143, 142, 327/198, 538, 543, 72

[56] References Cited

U.S. PATENT DOCUMENTS

| | | | |
|---|---|---|---|
| 4,717,840 | 1/1988 | Ouyang et al. | 307/594 |
| 4,888,498 | 12/1989 | Kadakia | 307/296.4 |
| 5,376,835 | 12/1994 | Van Buskirk et al. | 327/198 |
| 5,508,649 | 4/1996 | Shay | 327/143 |
| 5,519,347 | 5/1996 | Kim | 327/143 |

*Primary Examiner*—Toan Tran
*Attorney, Agent, or Firm*—Fleshner & Kim

[57] ABSTRACT

A power-up detection circuit which generates a power-up detection pulse by comparing the directly applied power supply voltage and the delayed power supply voltage so that the application of power supply voltage thereto is exactly detected even though the power supply voltage has a varying rise time. The circuit is disabled when the delayed power supply voltage rises to the full power supply voltage level after a predetermined delay time.

11 Claims, 5 Drawing Sheets

POWER-UP DETECTION CIRCUIT

BACKGROUND OF THE INVENTION

1. Field of the Invention

The present invention relates to a power-up detection circuit for an integrated circuit and, more particularly, to a circuit for detecting a power supply input to the circuit and creating a pulse output signal each time that a circuit is energized by a source of power regardless of a varying rise time of the power supply voltage.

2. Description of the Prior An

When power is first applied to a variety of integrated circuits, it is often desirable to reset certain circuit elements such as logic flip-flops and memory shift registers to some predetermined initial state. Forcing the circuit elements to a predetermined state tends to prevent unpredictable and unwanted operations that sometimes occur during or shortly after the time interval required for the voltage at the power supply input terminal to rise to a steady-state value. This circuit initialization process is commonly achieved by a power-up detection circuit which detects the power supply to the circuit and supplies an initial pulse output signal to the various circuit elements for a brief period of time after the circuit is turned on.

As shown in FIG. 1, a conventional power-up detection circuit is commonly comprised of a P-channel metal-oxide semiconductor (P-MOS) transistor 1 having its gate connected to ground and its source connected to the power supply voltage Vdd, a P-MOS transistor 2 having its gate and drain commonly connected to a node N1 and its source connected to the drain of the P-MOS transistor 1, a P-MOS transistor 3 having its source-drain path connected between the power supply voltage Vdd and the node ND1 and its gate supplied with a feed-back signal from an inverter 7, an N-channel metal-oxide semiconductor (N-MOS) capacitor 4 having its gate connected to the node ND1 and its drain and source connected to ground, series inverters 5–7 which sequentially invert a signal outputted from the node ND1, a P-MOS capacitor 8 having its drain and source commonly connected to the power supply voltage Vdd and its gate connected to a drain-source connection point of the P-MOS transistors 1 and 2, a P-MOS capacitor 9 having its drain and source commonly connected to the power supply voltage Vdd and its gate connected to a node ND2 which is the output terminal of the inverter 5, and a pulse generating circuit 10 which generates a power-up detection pulse, corresponding to the output signal from the inverter 7.

When the power supply voltage Vdd is applied to the above described conventional circuit, the voltage is applied to node ND1 via turned-on P-MOS transistors 1 and 2, and the voltage of node ND1 is applied to inverter 5 with a predetermined delay time (R-C delay time) by P-MOS transistors 1, 2 and N-MOS capacitor 4. Therefore, the voltage at node ND1 is the power supply voltage with the predetermined delay time and thus the logic state of node ND1 transits from low to high after the delay time. The transition of the logic state at node ND1 is inverted by inverters 5–7, respectively.

By the way, when the logic state of node ND1 is low during the R-C delay time at the early stage of the operation, inverter 7 outputs a logic high signal to the gate of P-MOS transistor 3 to render it nonconductive. However, when the logic state of node ND1 becomes a logic high level after the R-C delay time, inverter 7 outputs a logic low level signal to the gate of P-MOS transistor 3, thus maintaining the logic state of node ND1 to be high with the conductive P-MOS transistor 3. As explained hereinabove, P-MOS transistor 3 maintains the logic state of node ND1 to be low during the R-C delay time, and maintains the logic state of node ND1 to be high after the R-C delay time. P-MOS capacitor 8 controls the amount of the current flow from P-MOS transistor 1 to P-MOS transistor 2. Also, P-MOS capacitor 9 supports the logic state of node ND2 to be high during the R-C delay time in which the logic state of node ND1 is low, which in turn causes the logic state of the output signal from inverter 7 to be low and thus renders P-MOS transistor 3 to be turned off. Pulse generating circuit 10 generates the power-up detection pulse by using the transition of the logic state from high to low of the signal outputted from inverter 7.

However, when the rise time of the power supply voltage Vdd varies such that a slow rising power supply voltage or a fast rising power supply voltage is applied to the conventional circuit, the delay time of the voltage at node ND1 has a wide range, causing an exact detection of the power supply input to be impossible. Furthermore, an exact detection of the power supply input is impossible in the conventional circuit, when the power supply voltage is applied again shortly after an abrupt interruption of the power supply.

The novel features which are believed to be characteristic of the present invention will be better understood from the following detailed description, considered in connection with the accompanying drawings, wherein various circuits employing the present invention are described.

SUMMARY OF THE INVENTION

Accordingly, it is an object of this invention to provide a power-up detection circuit capable of detecting exactly whether the power supply voltage is applied to a circuit even though the power supply voltage has a varying rise time or the power supply voltage is applied again shortly after an abrupt interruption of the power supply.

In accordance with the present invention, the above and other objects can be accomplished by the provision of a power-up detection circuit for providing a pulse signal upon the application of power to the circuit comprising delay means for delaying a power supply voltage for a predetermined time, differential amplifier means for comparing the power supply voltage applied directly thereto and the power supply voltage applied thereto after being delayed by the delay means and outputting a resultant signal, and differential amplifier control means for enabling the differential amplifier means during the predetermined delay time responsive to the power supply voltage and the output signal from the differential amplifier means, and for disabling the differential amplifier means after the power supply voltage delayed by the delay means rises to the full power supply voltage level.

DESCRIPTION OF THE PREFERRED EMBODIMENTS

The following description is of the best presently contemplated modes of carrying out the invention and is made for the purpose of illustrating the general principles of the invention, and is not to be taken in a limiting sense, since various changes and modifications within the spirit and scope of the invention will become apparent to those skilled in the art from this detailed description.

Figure 1:
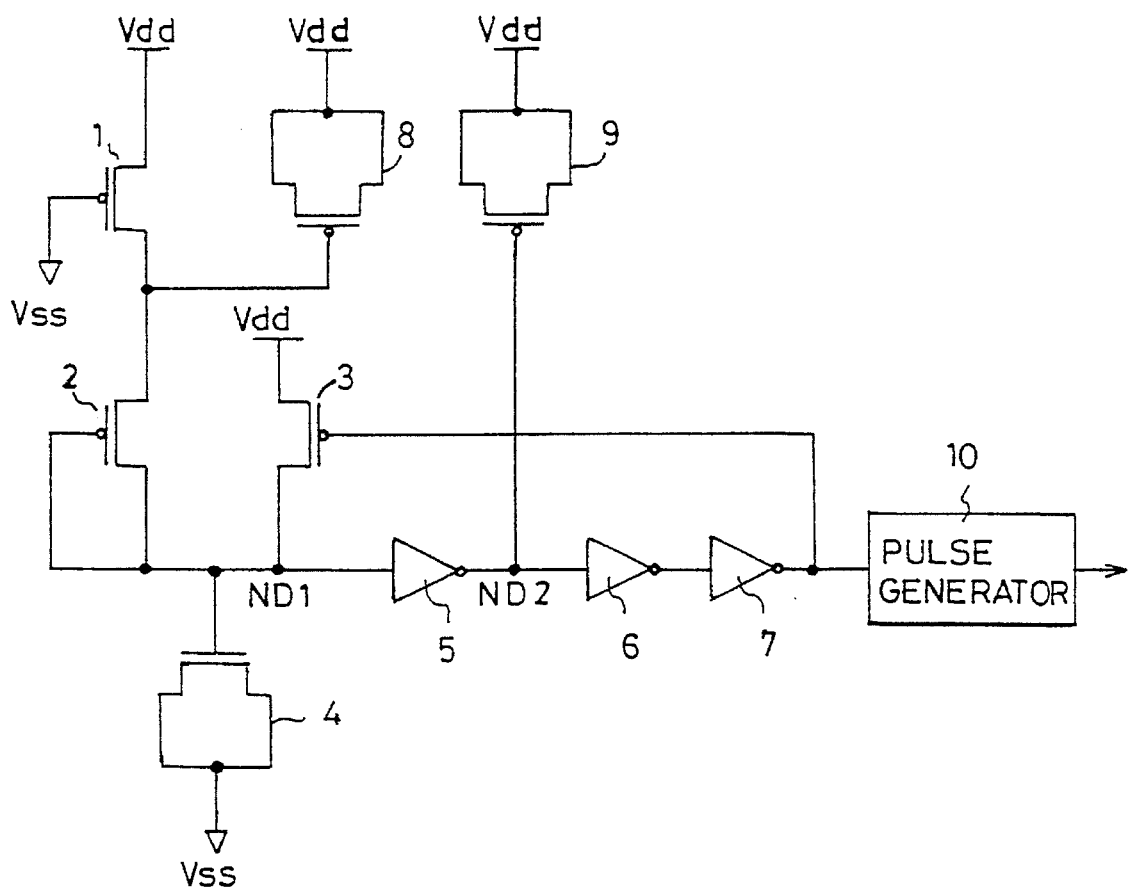
FIG. 1 is a circuit diagram illustrating a power-up detection circuit according to the prior art.
Figure 2:
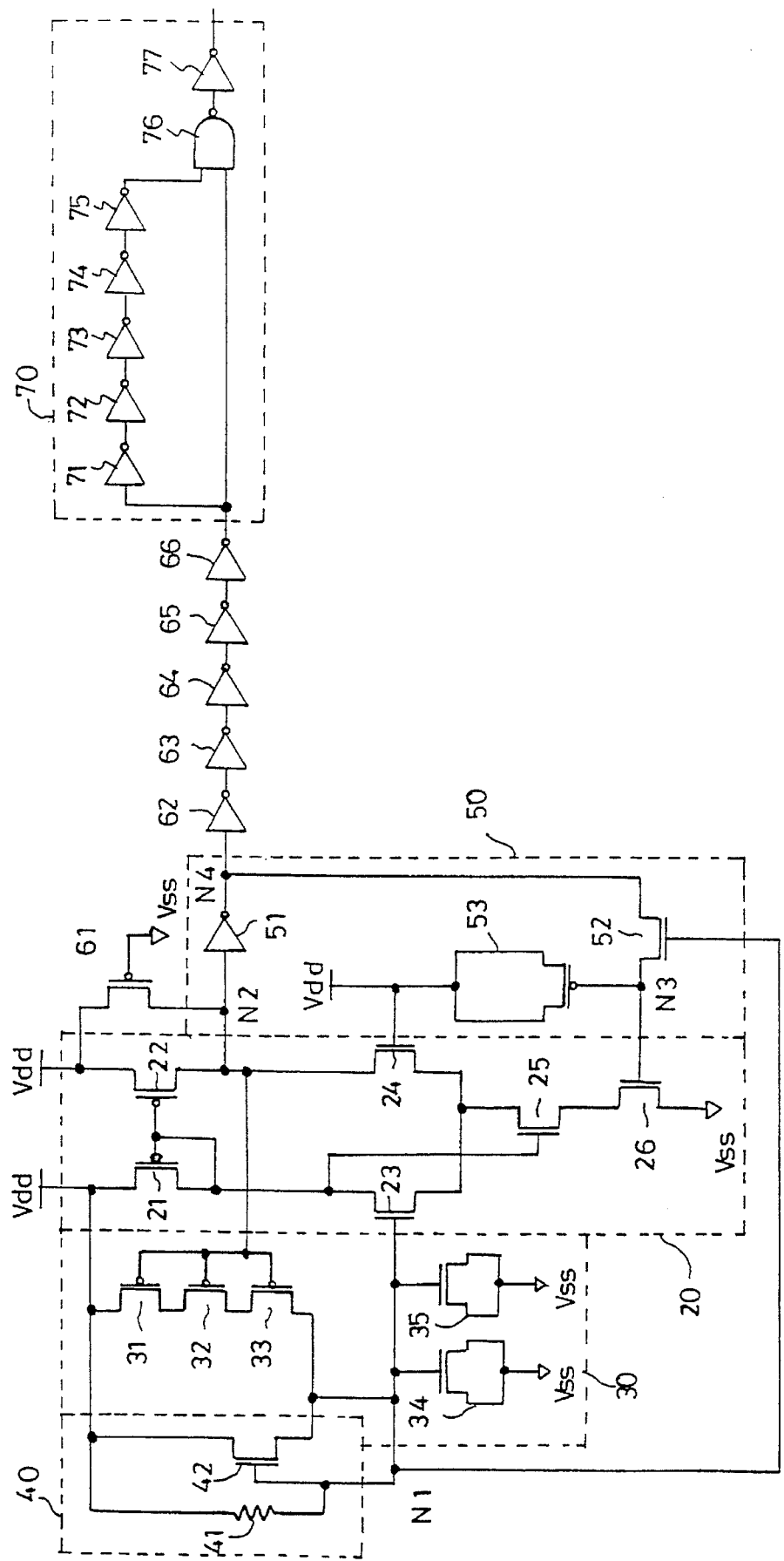
FIG. 2 is a circuit diagram of a first embodiment of a power-up detection circuit according to this invention.

Referring to FIG. 2, the circuit of the present invention is comprised of a differential amplifier 20 for generating an output signal by differencing an input power supply voltage Vdd applied without any delay time and the input power supply voltage Vdd delayed by some delay time, a delay circuit 30 for delaying the power supply voltage Vdd for a predetermined time and outputting the delayed power supply voltage Vdd to the differential amplifier 20 under the control of an output signal from the differential amplifier 20, a node control circuit 40 for forcing a voltage at a node N1 to follow the power supply voltage Vdd only when the power supply voltage Vdd is turned off, a differential amplifier enabling circuit 50 for enabling the differential amplifier 20 for a predetermined time responsive to a logic state of the voltage at node N1, the power supply voltage Vdd, and an inverted output signal from the differential amplifier 20, a P-MOS transistor 61 having its source connected to the power supply voltage Vdd, its gate connected to ground, and its drain connected to a node N2 for transferring the power supply voltage Vdd to the node N2, serially connected inverters 62–66 for sequentially inverting an output signal from a node N4, and a pulse generating circuit 70 for generating a power-up detection pulse responsive to an output signal from the inverter 66.

The differential amplifier 20 is a conventional current mirror type amplifier with an additional N-MOS transistor 25 connected between the source connection point of N-MOS transistors 23, 24 and the drain of an N-MOS transistor 26 which behaves as a current source. The N-MOS transistor 25 having its gate connected to the drain of N-MOS transistor 23 provides a better amplification factor even for a low power supply voltage Vdd. Also the voltage of a node N3 is applied to the gate of N-MOS transistor 26.

Delay circuit 30 is comprised of serially connected P-MOS transistors 31–33 having their gates commonly connected to the output terminal of differential amplifier 20 for transferring the power supply voltage Vdd applied to the source of transistor 31 to the drain of transistor 33, and N-MOS capacitors 34–35 having their gates connected between the drain of transistor 33 and the gate of transistor 23, for transferring the power supply voltage Vdd applied from the drain of transistor 33 to the gate of transistor 23 with a certain delay time determined by both transistors 31–33 and capacitors 34–35.

Node control circuit 40 is comprised of an N-MOS transistor 42 having its drain and source connected in parallel with the serially connected transistors 31–33, its drain and gate connected together through a resistor 41 and its gate and source connected to node N1.

Differential amplifier enabling circuit 50 is comprised of an inverter 51 for inverting the signal at node N2, an N-MOS transistor 52 for transferring, under the control of the signal voltage at node N1, the signal voltage from node N4 to node N3, and a P-MOS capacitor 53 having its gate connected to node N3 and its source and drain connected to the power supply voltage Vdd, for enabling differential amplifier 20 by controlling the state of node N3. Node control circuit 40 and differential amplifier enabling circuit 50 together behave as a differential amplifier control circuit to control the operation of differential amplifier 20.

Pulse generating circuit 70 is comprised of serial inverters 71–75 for sequentially inverting an output signal from the inverter 66, a NAND gate for performing a logical NAND operation upon the output signals from inverters 66 and 75, and an inverter 77 for inverting an output signal of NAND gate 76.

The overall operation of the present invention will now be described in detail. When the power supply voltage Vdd is first applied, node N1 maintains a low state during the R-C delay time determined by transistors 31–33 and N-MOS capacitors 34 and 35, thus causing the transistor 52 to remain nonconductive. Also, the state of node N2 is changed to high by the conduction of transistor 61 having its gate connected to ground and its source-drain path connected between the power supply voltage Vdd and node N2. Since the state of the voltage at node N2 is inverted from high to low by inverter 51, the state of node N4 becomes low. The state of node N4 can not be transferred to node N3 because the transistor 52 is turned off during the low state of node N1 so that the state of node N3 comes to be floating. With the node N3 floating, capacitor 53 becomes charged and thereby, due to the coupling capacitance effect thereof, causes the state of node N3 to rise to the high state.

Once the state of node N3 becomes high, the transistor 26 turns on and thereby differential amplifier 20 starts it operation. There are two input signals to the amplifier 20; one input signal is the directly applied power supply voltage Vdd to the gate of the transistor 24, and the other input signal is the power supply voltage Vdd applied with a predetermined delay time to the gate of the transistor 23. Until the amplifier 20 starts its operation after the power supply voltage Vdd is applied, the node N2 maintains its state to be high due to the conduction of transistor 61 and thereby causes the transistors 31–33 to remain nonconductive. When the amplifier 20 is in operation once the state of node N3 transits from low to high, most of the current flows through the path formed by transistors 22, 24, 25, and 26 due to the power supply voltage Vdd being directly applied to the gate of the transistor 24. So the resultant state of node N2 becomes low. Although node N2 tends to maintain its state high due to the conductive transistor 61 which transfers the power supply voltage Vdd to node N2, there is no problem to change the state of node N2 from high to low because the transistor 61 is given a very large source-drain resistance value. Once the state of node N2 is changed to low, the transistors 31–33 turn on. Therefore, the power supply voltage Vdd is delayed by the R-C delay time constant through transistors 31–33 and capacitors 34–35, and is applied to the gate of the transistor 23.

As delayed voltage rises to the full power supply voltage level with time so that both of the input voltages to the amplifier 20 become equal in level, then the state of node N2, which is the output terminal of the amplifier 20, transits to the high state again. When this high state voltage of node N2 becomes higher than the threshold voltage of the inverter 51, the state of node N4 also transits from high to low. The low state of node N4 is delivered to node N3 through the conductive transistor 52 and the low state of node N3 applied to the gate of transistor 26 renders the transistor 26 to be turned off, causing the amplifier 20 to be disabled. Since there is no current path in the disabled amplifier 20, node N2 maintains its high state by the conduction of transistor 61. Through sequential inverters 62–66, the low to high transition of the state at node N2 is outputted to pulse generating circuit 70, which in turn generates a power-up detection pulse.

When the power supply voltage Vdd rises from 0 V to its full power supply voltage level, node control circuit 40 does not exert any effect upon the state of node N1, with the conductive transistor 42 having its gate and source connected together, and the resistor 41 having a very large resistance value. But when the power supply voltage Vdd drops from its full voltage level to 0 V, the transistor 42 in effect interchanges its drain and source. Therefore, the transistor 42 having its gate and drain commonly connected to node N1 which receives the charged voltage of the capacitors 34–35 becomes conductive, which causes the capacitors 34–35 to instantaneously discharge their voltages which were charged during the previous powering up stage. As explained above, when the power supply voltage Vdd rises from 0 V to the full voltage level, node control unit 40 does not affect the potential of node N1. On the other hand, when the power supply voltage Vdd drops from the full voltage level to 0 V, node control circuit 40 causes the potential of node N1 to drop with the power supply voltage Vdd. Therefore, if the power supply voltage Vdd drops to 0 V and then again rises to the full supply voltage level, the state of node N1 follows the variation of the power supply voltage Vdd. Since the transition of the state at node N1 controls the switching of the transistor 52 which in turn controls the amplifier 20, the circuit of the present invention is able to detect exactly the variation of the power supply voltage Vdd.

Figure 3:
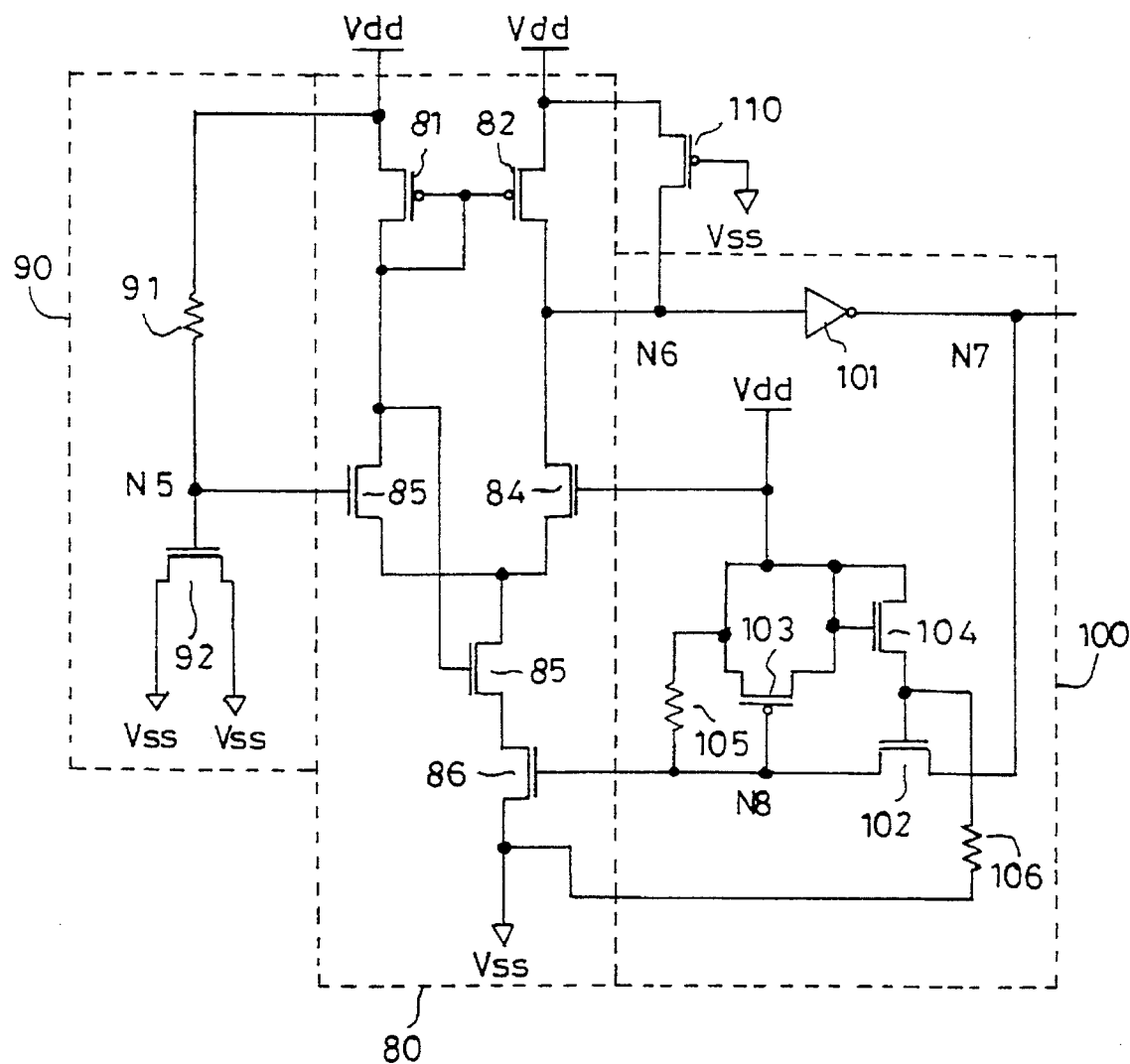
FIG. 3 is a circuit diagram of a second embodiment of a power-up detection circuit according to this invention.

Referring to FIG. 3, a second embodiment of the present invention is comprised of a differential amplifier 80, a delay circuit 90, a differential amplifier enabling circuit 100, and a P-MOS transistor 110, wherein the differential amplifier 80 and the P-MOS transistor 110 are equivalent to the differential amplifier 20 and the P-MOS transistor 61 of the first embodiment of the present invention. Delay circuit 90, having a series resistor 91 connected to the gate of an N-MOS transistor 92 having its drain and source connected to ground and its gate connected to node N5 to form thereby a R-C circuit, applies the power supply voltage Vdd with a predetermined delay time to the gate of an N-MOS transistor 83 of the amplifier 80. Differential amplifier enabling circuit 100, having a similar circuit configuration to the differential amplifier enabling circuit 50 of the first embodiment, further includes an N-MOS transistor 104 and resistors 105 and 106. The transistor 104 has its gate and drain connected to the power supply voltage Vdd and to the one terminal of the capacitor 103 and its source connected to the gate of the transistor 102. The resistor 105 has its one terminal connected to the power supply voltage Vdd and to the other terminal of the capacitor 103 and its other terminal connected to a node N8. Also, the transistor 102 has its gate connected to ground through a resistor 106. The inverters 62–66 and the pulse generating circuit 70 of the first embodiment will be connected in the same way in the second embodiment as in the first embodiment and are therefore not shown nor described further here.

Since most of the operation of the second embodiment is similar to that of the first embodiment, the distinctive features of the second embodiment over the first embodiment will be explained hereinafter. If the power supply voltage Vdd exceeds the threshold voltage of the transistor 104, the transistor 104 turns on. The voltage at the source of the conductive transistor 104 is applied to the gate of the transistor 102, thereby causing the transistor 102 to turn on. When the power supply voltage Vdd is 0 V, the gate of the transistor 102 is connected to ground through the resistor 106 so that transistor 102 turns off. In conjunction with the capacitor 103, the resistor 105 is adapted to transit the state of node N8 to high at the early stage of the operation.

Figure 4A:
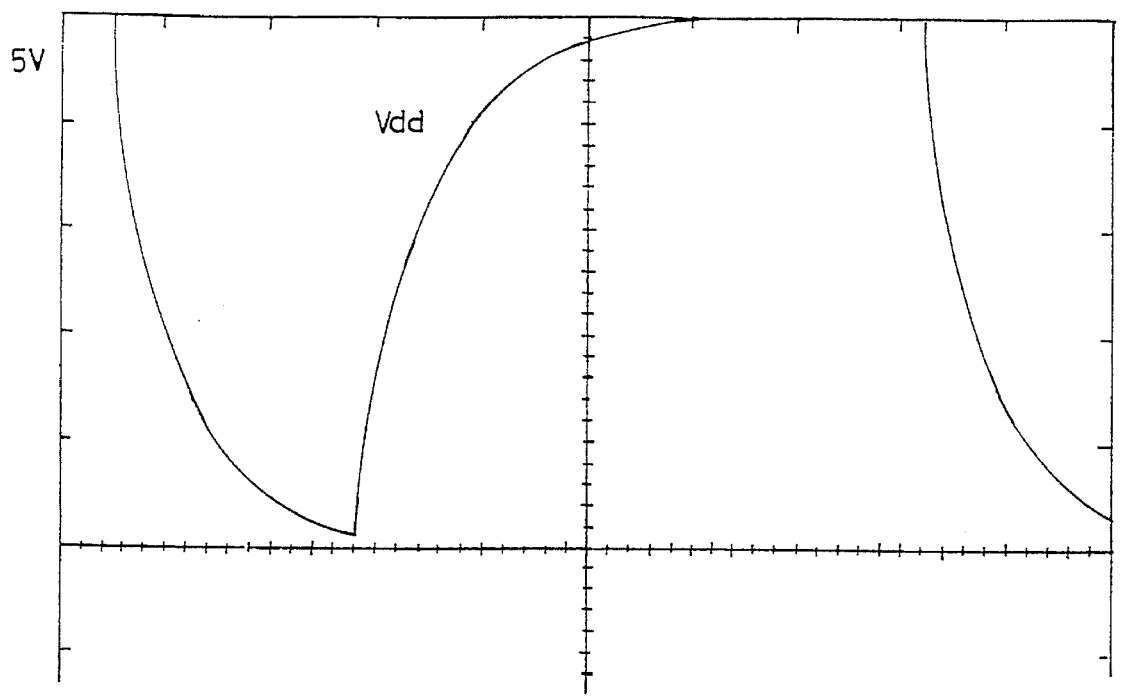
FIGS. 4(A) to 4(C) are illustrative diagrams showing power-up detection pulses generated with respect to input power supply voltages having a varying rise times.
Figure 4B:
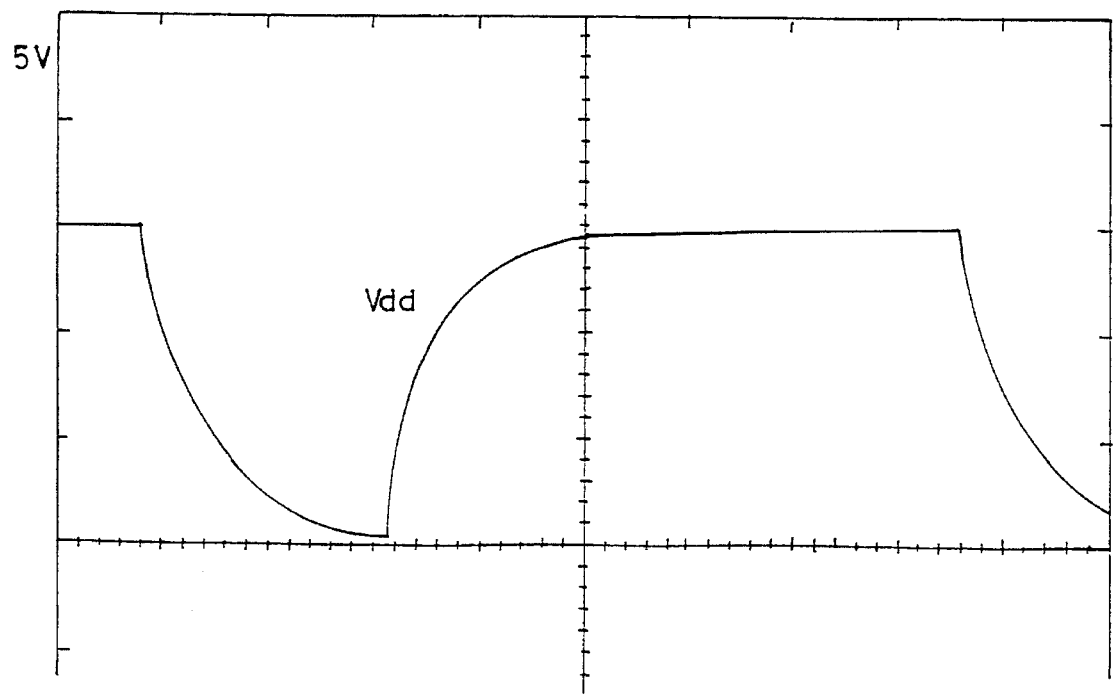
Figure 4C:
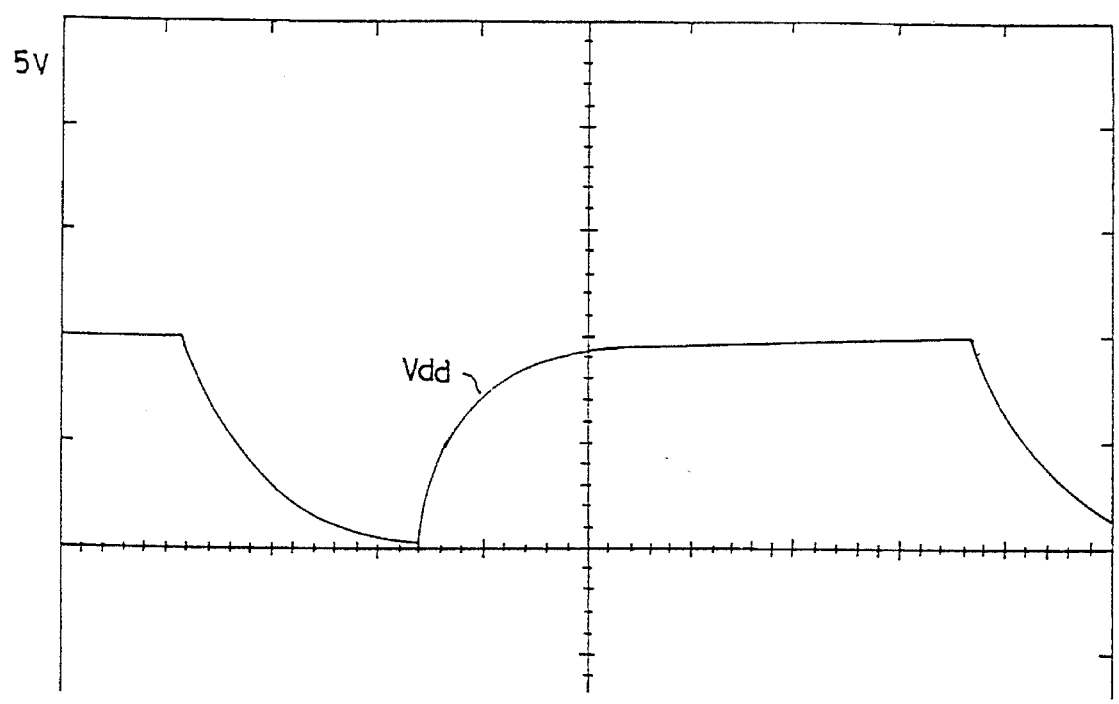

As explained in detail above, with the use of the power supply voltage directly applied and the power supply voltage applied with a, predetermined delay time, the present invention can advantageously detect exactly application of the power supply voltage, though the power supply voltage has a varying rise time. FIGS. 4(A) to (C) show experimental results of the power-up detection by the present invention, when the power supply voltages are 5 V, 3 V and 2 V, respectively. As shown in FIG. 4, it is understood that the power-up detection pulse is correctly generated in spite of the varying rise time of the power supply voltage. Moreover, the present invention is able to control appropriately the time when the power-up detection pulse is generated by adjusting the R-C delay time.

What is claimed is:

1. A power-up detection circuit for detecting the application of power to the circuit, comprising:

delay means for delaying a power supply voltage for a predetermined delay time;

differential amplifier means for comparing the power supply voltage applied directly thereto and the power supply voltage applied thereto after being delayed by the delay means and outputting a resultant signal; and differential amplifier control means for enabling the differential amplifier means during the predetermined delay time responsive to the power supply voltage and the output signal from the differential amplifier means, and for disabling the differential amplifier means after the power supply voltage delayed by the delay means rises to a full power supply voltage level.

2. The circuit of claim 1, wherein the delay means includes:

at least one transistor for transferring the power supply voltage to the differential amplifier means, responsive to the output signal from the differential amplifier means; and at least one MOS capacitor having its gate connected to receive an output signal from the at least one transistor and its drain and source connected to ground for charging the output signal from the at least one transistor.

3. The circuit of claim 2, wherein the at least one transistor is a P-MOS transistor.

4. The circuit of claim 1, wherein the delay means includes:

a series resistor for transferring the power supply voltage to the differential amplifier means; and at least one MOS capacitor having its gate connected to the series resistor and its drain and source connected to ground.

5. The circuit of claim 1, wherein the differential amplifier control means includes:

a first transistor connected to and switching an inverted output signal from the differential amplifier means, responsive to a control signal, the control signal is responsive to the power supply voltage; and a MOS capacitor having its drain and source connected to the power supply voltage and its gate connected to the first transistor and the differential amplifier means for outputting under the control of the first transistor a signal to enable the differential amplifier means during the delay time by charging the power supply voltage which is applied to the drain and source thereof, and for outputting a signal to disable the differential amplifier means after the delay time.

6. The circuit of claim 5, wherein the control signal is outputted from a connection point between a gate-source connection of a second transistor and an input terminal of the differential amplifier means, wherein the second transistor has its drain connected to the power supply voltage and its source and gate commonly connected to an input terminal of the differential amplifier means that is connected to the delay means, and a resistor is provided between the power supply voltage and the gate-source connection of the second transistor.

7. The circuit of claim 5, wherein the control signal is outputted from a third transistor having its gate and drain commonly connected to the power supply voltage and its source connected to the gate of the first transistor.

8. The circuit of claim 7, wherein the third transistor has its source connected both to the gate of the first transistor and to ground through a resistor.

9. The circuit of claim 5, wherein the MOS capacitor further has its drain-source connection point connected to its gate through a resistor.

10. The circuit of claim 1, wherein the differential amplifier means includes a transistor having its source connected to the power supply voltage, its drain connected to an output terminal thereof, and its gate connected to ground, for maintaining constantly a voltage of the output terminal of the differential amplifier means when the differential amplifier means is disabled.

11. The circuit of claim 1, further comprising a pulse generating means for generating a power-up detection pulse, responsive to the output signal from the differential amplifier means.

* * * * *